(12) United States Patent
Jyumonji

(10) Patent No.: US 7,241,702 B2
(45) Date of Patent: Jul. 10, 2007

(54) PROCESSING METHOD FOR ANNEALING AND DOPING A SEMICONDUCTOR

(75) Inventor: Masayuki Jyumonji, Yokohama (JP)

(73) Assignee: Kabushiki Kaisha Ekisho Sentan Gijutsu Kaihatsu Center (JP)

( * ) Notice: Subject to any disclaimer, the term of this patent is extended or adjusted under 35 U.S.C. 154(b) by 0 days.

(21) Appl. No.: 11/058,344

(22) Filed: Feb. 14, 2005

(65) Prior Publication Data

US 2005/0159014 A1 Jul. 21, 2005

Related U.S. Application Data

(62) Division of application No. 10/394,479, filed on Mar. 21, 2003, now Pat. No. 6,911,717.

(30) Foreign Application Priority Data

| Mar. 26, 2002 | (JP) | ............................... 2002-84822 |
| Mar. 11, 2003 | (JP) | ............................... 2003-65188 |

(51) Int. Cl.
*H01L 21/31* (2006.01)
*H01L 21/469* (2006.01)

(52) U.S. Cl. .................... 438/766; 438/149; 257/452

(58) Field of Classification Search ................ 438/149, 438/680, 766, 909, 914; 257/452, 659, 660
See application file for complete search history.

(56) References Cited

U.S. PATENT DOCUMENTS

| 4,728,770 A | * | 3/1988 | Kaprelian | .............. 219/121.83 |
| 5,231,047 A | | 7/1993 | Ovshinsky et al. | |
| 5,386,798 A | * | 2/1995 | Lowndes et al. | ............. 117/50 |
| 5,499,599 A | | 3/1996 | Lowndes et al. | |
| 6,809,314 B2 | * | 10/2004 | Yoshida et al. | ............. 250/288 |
| 2002/0151115 A1 | * | 10/2002 | Nakajima et al. | ........... 438/149 |

FOREIGN PATENT DOCUMENTS

| JP | 8-51207 | 2/1996 |
| JP | 2002-122881 | 4/2002 |

* cited by examiner

*Primary Examiner*—Phuc T. Dang
(74) *Attorney, Agent, or Firm*—Graybeal Jackson Haley LLP

(57) ABSTRACT

A treatment method of annealing and doping a semiconductor including irradiating a semiconductor layer (13) formed on a substrate (11) with a laser beam (a), thereby melting at least a part of the semiconductor layer; irradiating a target material (2) including atoms with which the semiconductor layer is to be doped with the laser beam (a'), thereby ablating the atoms of the target material; and doping the melted semiconductor layer with the ablated atoms.

19 Claims, 7 Drawing Sheets

PROCESSING METHOD FOR ANNEALING AND DOPING A SEMICONDUCTOR

CROSS-REFERENCE TO RELATED APPLICATION

This application is a divisional application of co-pending U.S. Continuation-in-Part utility application number 10/394,479, filed on 21 Mar. 2003now U.S. Pat. No. 6,911,717, which is incorporated herein by reference, and claims foreign priority benefits under 35 USC §119 (a) to Japan Application No. 2002-84822, filed 26 Mar. 2002 and Japan Application No. 2003-65188, filed 1 Mar. 2003.

BACKGROUND OF THE INVENTION

1. Field of the Invention

The present invention relates to a treatment method for annealing and/or doping of semiconductor.

2. Description of the Prior Art

A large scale semiconductor integrated circuit (referred to as "LSI" hereinafter) is manufactured by means of many processes, for example, a process of forming thin films made of various sorts of materials, a photolithographic process of processing a film made of a semiconductor and a film made of others to form each film in a certain shape, a process of adding an impurity (referred to as "dopant" hereinafter) to the semiconductor (referred to as "doping" hereinafter), a dopant activation process for electrically activating the dopant inside the semiconductor, and so forth.

An ion doping method is well known as a typical method of adding a dopant used in the above doping process. This method ionizes a specific impurity and dopes a semiconductor crystal with a certain amount of the above ionized impurity. Furthermore, this method has an advantage in that the concentration distribution and diffusion depth of the dopant can be controlled with high accuracy and good reproducibility. In order to repair the defect in crystalline structure which is caused by this ion doping and also to activate the dopant as doped, the above semiconductor is heat-treated in a heat treatment furnace for annealing, which is generally kept at a temperature exceeding 1000° C. (referred to as "process temperature" hereinafter).

In recent years, in association with the process of manufacturing a device constituting the LSI, for example, a metal-oxide-semiconductor (referred to as "MOS" hereinafter) transistor provided with an extremely shallow junction having several tens nm thickness or less, there is studied a laser anneal method as a method of activating the dopant, which is performed after the semiconductor is doped therewith by means of the ion doping method.

In the field of the liquid crystal display (referred to as "LCD" hereinafter), the thin film transistor (referred to as "TFT" hereinafter) including a semiconductor thin film formed on an insulator, is used mainly as a switching device controlling the voltage applied to respective pixels of the LCD.

In order to realize reducing the cost of the LCD, enlarging the display panel area of the LCD, and providing a high performance LCD, and so forth, there has been made every effort to develop a new method enabling a high performance TFT to be manufactured at a process temperature (600° C. or less), which is lower than the prior process temperature of 1000° C.

In the process of manufacturing the high performance TFT, the laser anneal method is used for forming a thin film made of amorphous silicon (referred to as "a-Si" hereinafter) on an insulating film formed directly or indirectly on a substrate, and irradiating the a-Si thin film with the laser beam to melt and crystallize (mainly poly-crystallize) at least a part of the above a-Si thin film. This method has following merits. One is that as a thin film made of a low temperature poly-silicon (referred to as "p-Si" hereinafter) is formed, the substrate on which the above thin film is directly or indirectly formed is less affected thermally, the second is that the high throughput can be realized, and the third is that the inexpensive glass substrate, plastic base plate and others may be utilized.

In the process of manufacturing the TFT, this laser anneal method may be actively used not only for changing the crystalline state from a-Si to p-Si, but also for annealing the dopant after finishing the doping process.

FIG. 7 is a flow chart for roughly showing a prior art steps of manufacturing a semiconductor device by way of an example of a TFT manufacturing method using the ion doping method as well as the laser anneal method (see the following patent document 1).

Patent Document 1: JP Patent Public Disclosure 8-51207
Patent Document 2: JP Patent Publication 2002-122881

These documents describe that it is necessary to activate the dopant by the laser anneal after performing the doping of the dopant ion, thus increasing the number of manufacturing steps.

As shown in FIG. 7(a), after forming the a-Si film 22 on an insulating substrate 21, the a-Si film 22 is doped with the n-type dopant (c) such as phosphorus to make the a-Si film 22 an n-type a-Si film 30 (FIG. 7(b)) (channel doping).

As shown in FIG. 7(b), the n-type a-Si film 30 is annealed by using an irradiation by laser beam (a) from an excimer laser system, thereby melting and crystallizing (or recrystallizing) the n-type a-Si film 30 to change it into an n-type p-Si film (not shown).

In the next, as shown in FIGS. 7(c) to 7(e), in order to form a plurality of TFT devices, the n-type p-Si film is processed to form a plurality of island shaped n-type p-Si layers 31, a gate oxide film 23 is formed to cover the insulating substrate 21 and n-type p-Si layer 31, and then, a gate electrode 24 is formed on the gate oxide film 23 according to a certain pattern form.

As shown in FIG. 7(f), the doping of the n-type dopant (c) such as phosphorus is performed by making use of the gate electrode 24 as a protective mask against doping the dopant to form source and drain regions of the TFT. In this way, there is formed the principal portion of a depression type n-channel MOS transistor, of which the source and drain regions contact with each other through an n-type channel layer.

As shown in FIG. 7(g), with laser-annealing process by using an irradiation by laser beam (a) from the excimer laser system, the dopant as ion-doped is activated, and the crystal damage in the p-Si film caused by the ion doping is recovered.

After this step, as shown in FIG. 7(h), a passivation film 25 such as made of silicon oxide, is formed on the top of the above structure. Still further, as shown in FIG. 7(i), the above passivation film 25 is processed to form necessary contact holes in the above passivation film 25 and then, metal leads 26 for electrodes use are formed. With the manufacturing steps as described in the above, the semiconductor device is manufactured.

In the above conventional process for manufacturing the semiconductor device, however, the step of doping of the dopant and the step of laser anneal are separated from each other by a step or steps intervening between them. Because of this, the number of manufacturing steps was increased and works were unnecessarily complicated.

If the equipment for each of the step of doping the dopant and the step of laser anneal has to be separately prepared, some inconvenient situations come out. For example, it is required to carry out the substrate cleaning in each of the above separate equipments; the inside of each equipment is easily contaminated due to the substrate cleaning carried out before and after the step of the doping; and further, it was highly risky because a poisonous gas source was generally used in the doping equipment, so it required large scale additional facilities in order to eliminate the danger.

SUMMARY OF THE INVENTION

The invention has been made in view of the aforesaid various points to be improved. Accordingly, embodiments of the invention is to provide a treatment method for annealing and/or doping of semiconductor layer, whereby the entirety of the manufacturing process can be simplified.

Embodiments of the invention also provide a treatment method for annealing and/or doping of semiconductor, whereby not only the number of steps of manufacturing a semiconductor device can be reduced, but also the safety in the working environment can be improved.

According to the invention, a first method embodiment thereof relates to a treatment method for annealing and/or doping of a semiconductor, which comprises irradiating a semiconductor layer formed on a substrate with a first laser beam in a controlled environment, thereby melting at least a part of the semiconductor layer; irradiating a target material including atoms with which the semiconductor layer is to be doped with a second laser beam, thereby ablating the atoms of the target material to make them available to the semiconductor layer; and doping the melted semiconductor layer with the ablated atoms and allowing the semiconductor layer to recrystalize.

According to a second method embodiments of the invention, another treatment method for annealing and/or doping of a semiconductor comprises irradiating a semiconductor layer formed on a substrate with a laser beam in a controlled enviroment, thereby melting at least a part of the semiconductor layer; irradiating with a reflected portion of said laser beam a target material having atoms with which the semiconductor layer is to be doped, thereby ablating the atoms of the target material to make them available to the semiconductor layer; and doping the melted semiconductor layer with the ablated atoms.

According to these embodiments of the invention, at least a part of the semiconductor layer is melted by irradiating it with the above-mentioned laser beam, and the semiconductor layer is doped with the ablated atoms through the exposed surface of the melted semiconductor layer. With this, as it becomes possible to carry out, at the same time or continuously, both of processes of doping the semiconductor layer with the above atoms and of melting and crystallizing (or recrystallizing) the semiconductor layer. Accordingly, doping and annealing processes can be carried out as single process, either concurrently or in a temporary overlapping manner.

Preferably, the above laser beams are one of a pulsed laser beam or a continuous-wave laser beam. Also, it is preferable that the wavelength of the above laser beams is selected from the whole range of wavelengths from vacuum ultraviolet to infrared.

The above-mentioned substrate is made of any one of glass material, silicon material or plastic material.

Both method embodiments referenced above permit the simultaneous or at least temporally overlapping creation of a doped semiconductor layer that has undergone an annealing process.

In the first method embodiment referenced above, the semiconductor layer and target material may be arranged such that the surface of the semiconductor layer which is irradiated with the first laser beam makes an angle ranging from 0° to 90°, preferably at an angle of 0° (parallel), to the surface of the target material, which is irradiated with the second other laser beam.

Preferably, the second laser beam irradiating unit is arranged such that the angle of incidence of the other laser beam to irradiate the target material ranges from 10° to 90°, still is preferably 45°.

The above-described methods with respect to the first method embodiment may be carried out in an air shield chamber, in order to control the environment in which the semiconductor layer and target material reside.

The methods with respect to the second method embodiment described above and below may also be carried out in an air shield chamber, in order to control the environment in which the semiconductor layer and target material reside.

In the second method embodiment referenced above, the semiconductor layer and the target material may be arranged such that the surface of the semiconductor layer which is irradiated with the first laser beam makes an angle ranging from 0° to 90°, preferably at an angle of 0° (parallel), to the surface of the target material, which is irradiated with the reflected laser beam.

A feature of various method embodiments of the invention includes adjusting the angle of incidence of the first and second laser beam to irradiate the target material such that the angle of incidence ranges from 10° to 90°, and is preferably 45°.

Another feature of various method embodiments of the invention provides for selectively irradiating portions of the semiconductor layer.

Still another feature of various method embodiments of the invention provides for placing the target material proximate to the semiconductor layer.

DETAILED DESCRIPTION OF THE PREFERRED EMBODIMENTS

Preferred embodiments according to the invention will now be described in detail in the following with reference to the accompanying drawings.

Figure 1:
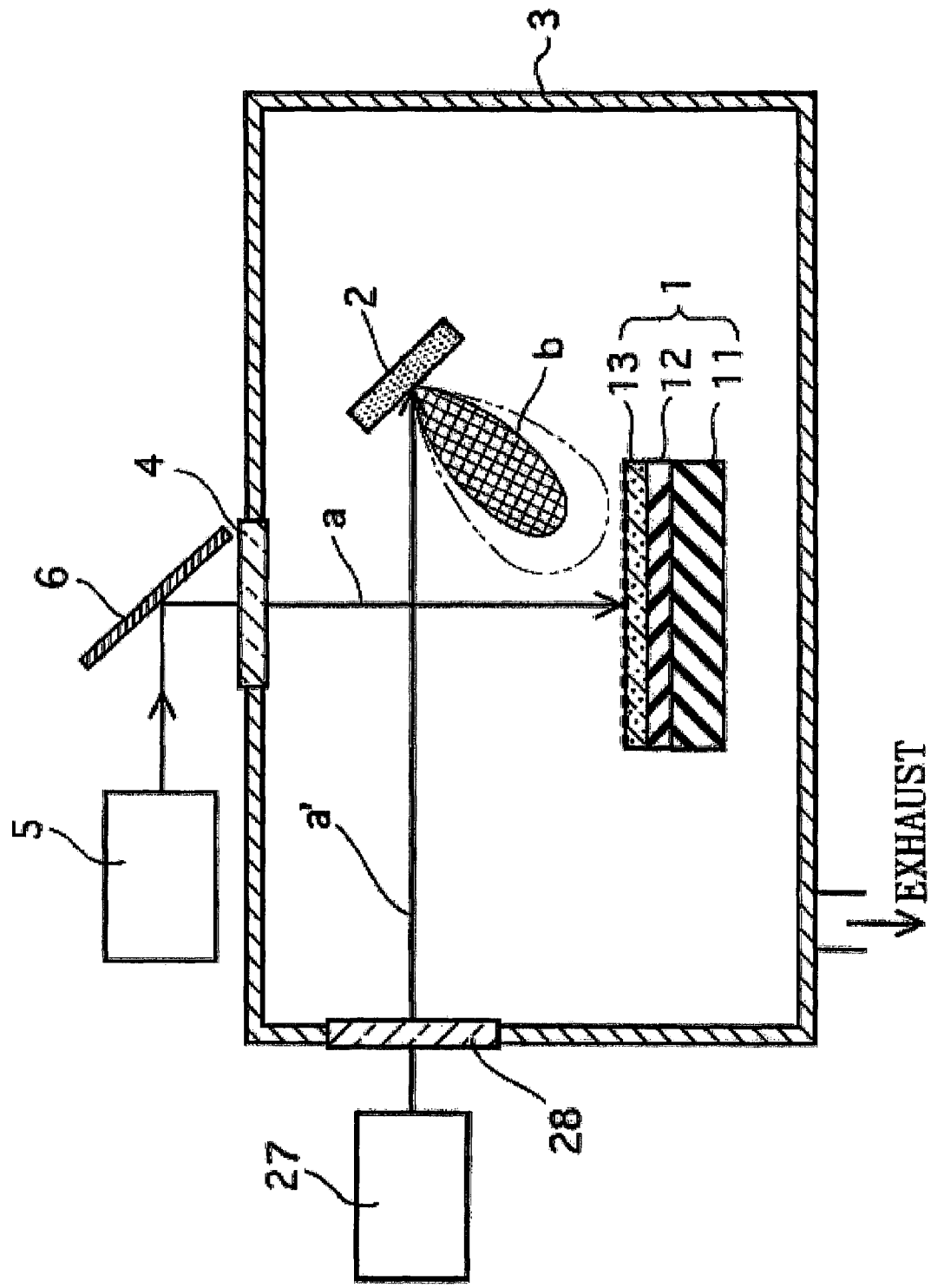
FIG. 1 is a diagram schematically showing treatment apparatus for annealing and/or doping of semiconductor according to an embodiment of the invention.

FIG. 1 schematically shows a treatment apparatus for annealing and/or doping of semiconductor according to an embodiment of the invention. This apparatus is made up of an optical system for annealing a semiconductor and another optical system for doping the semiconductor with a dopant.

In the treatment apparatus for annealing and/or doping of semiconductor as shown in FIG. 1, a plate 1 to be treated (referred to as "treated plate" hereinafter) provided on a substrate supporting table 3a and a target plate 2 containing a target material are arranged in a chamber 3 made of an air shield chamber. The air shield chamber, for example, the chamber 3 is made of a metal, for example, aluminum with airtightness. The upper wall of the chamber 3 is fitted with a window 4 with airtightness, the window 4 is made of a quartz glass or the like so as to allow a laser beam to pass it through. Laser systems 5, 27 and a mirror 6 for guiding the laser beam to the treated plate 1 are arranged outside the chamber 3.

The chamber 3 is connected with an exhaust pump (not shown), by which the pressure inside the chamber 3 is reduced and kept at a pressure of, for example, $1 \times 10^{-6}$ Pa or lower.

The treated plate 1 is made up of a substrate 11, a foundation oxide film 12 such as an $SiO_2$ layer and a semiconductor film (semiconductor layer) 13 made of, for example, a amorphous silicon layer stacked one after another on the substrate 11.

The target plate 2 is made up of a supporting plate (not shown) and a target material. The target material is formed on the above supporting plate to have a roughly flat surface and includes a dopant (impurity), such as, for example, phosphorus, with which the semiconductor film 13 is doped. The target plate 2 may be prepared in various ways, for example, it may be formed by bonding the target material to the supporting plate or by painting a mixture of the target material on the surface of the supporting plate, and so forth. In the example as shown in FIG. 1, the target plate 2 is formed by bonding the target material to the supporting plate Also, in the example as shown in FIG. 1, the surface of the target material is arranged to face the surface of the treated plate 1 located downward.

In the example as shown in FIG. 1, the treated plate 1 and the target plate 2 are arranged in the chamber 3 such that the surface of the semiconductor film 13 located on the front side of the treated plate 1 faces the surface of the target material on the target plate 2.

The laser beam (a) which is emitted by the laser system 5 for annealing the semiconductor layer 13 changes its optical path via the mirror 6 to pass through the window 4 and is then incident on the surface of the semiconductor film 13 lying on the top of the treated plate 1. The angle of incidence of the laser beam (a) to the semiconductor film 13 can be changed by adjusting the angle of inclination of the mirror 6.

The laser beam (a) having been incident on the surface of the semiconductor film 13 is absorbed by the semiconductor film 13. The laser beam (a) absorbed by the semiconductor film 13 is turned into thermal energy to melt the semiconductor film 13. After irradiating the semiconductor film 13 with the laser beam (a), crystallization (or recrystallization) of the semiconductor film 13 goes on while the melted semiconductor film 13 is being solidified.

On one hand, the laser beam (a') emitted from another laser system 27 passes through another window 28 and is incident on the target plate 2 to ablate the dopant contained therein. In the target plate 2 having received the laser beam (a'), atoms of the dopant are driven out by this laser beam (a'), and at the same time, atoms from the target plate 2 are released by thermal energy caused by rapid temperature rise due to the laser beam irradiation. In other words, the laser ablation takes place with regard to the target material, thereby generating a plume (b) made of atoms released out of the target material. This plume (b) is made of atoms contained in the target plate 2.

The plume (b) rapidly diffuses to reach the surface of the treated plate 1. As a result, atoms in the plume (b), as impurity, namely, dopant, are supplied to the semiconductor film 13 in the melted state; in other words, the semiconductor film 13 is doped with atoms in the plume (b) as the dopant produced by the laser ablation.

As described above, the following two processes are carried out almost at the same time. That is, one is the doping the semiconductor film 13 with the dopant produced by the laser ablation while the other is the crystallization (or recrystallization) of the semiconductor film 13 by the laser anneal.

In the example as shown in FIG. 1, the surface of the semiconductor film 13 is exposed entirely. Instead of this, the surface of the semiconductor film 13 may be exposed at least in part. For example, an insulating film having a contact hole may be formed on the semiconductor film 13, thereby exposing the semiconductor film 13 in part through the contact hole.

Like this, if the semiconductor film 13, which is exposed in part, is irradiated with the laser beam (a) emitted from the laser system 5, a part of the laser beam (a) is directly incident on the semiconductor film 13 though the above contact hole while the remaining part of the laser beam (a) penetrates through the above insulating film and is incident on the semiconductor film 13. Furthermore, the semiconductor film 13 is doped with the above atoms as the dopant through the exposed surface of the semiconductor film 13. With this, the semiconductor film 13 is entirely crystallized (or recrystallized) and still further, portion in the vicinity of the exposed surface of the semiconductor film 13 is formed as a semiconductor film having a specific conductive type, for example, an n-type in case of this example.

The time difference between the start time of doping of the dopant and the start time of crystallization by the laser anneal can be controlled with ease, for example, by controlling the emission time, of emitting the laser beams from the laser systems 5 and 27.

Figure 2:
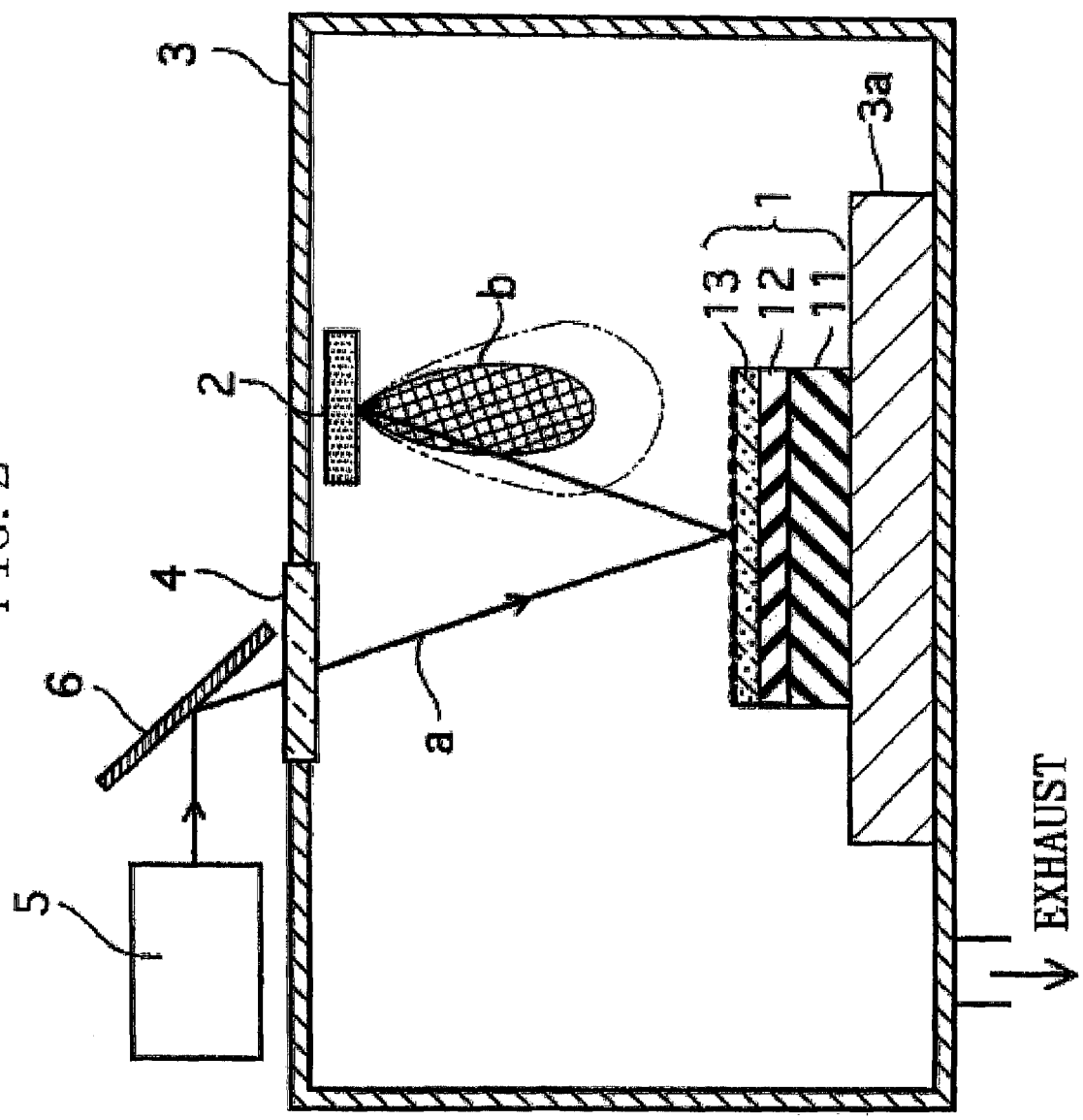
FIG. 2 is a diagram schematically showing treatment apparatus for annealing and/or doping of semiconductor according to another embodiment of the invention.

In the next, instead of the embodiment as shown in FIG. 1, another embodiment of treatment apparatus for annealing and/or doping of semiconductor according to the invention will be described in detail in the following with reference to FIG. 2. In this figure, the same parts as shown in FIG. 1 are designated with the same reference numerals and marks in order to avoid repetition of detailed descriptions thereabout. In the treatment apparatus for annealing and/or doping of semiconductor as shown in FIG. 2, there is used a single laser system 5. In this embodiment, a laser beam having been incident for annealing purpose is reflected in part and this reflected laser beam is used for the ablation of the dopant. A treated plate 1 and a target plate 2 are arranged in a chamber 3 so as to face each other in the up and down direction.

In the constitution as described above, the laser beam (a) emitted from the laser system 5 changes its optical path by means of the mirror 6 and passes through the window 4 to be incident on the surface of the semiconductor film 13 located on the top of the treated plate 1. The laser beam (a) having been incident on the surface of the semiconductor 13 is absorbed in part thereby and then turns into thermal energy and melts the semiconductor film 13. The remaining laser beam is reflected and is then incident on the target plate 2 to release the dopant.

The laser beam (a) absorbed in the semiconductor film 13 turns into thermal energy to melt the semiconductor film 13. On the other hand, the laser beam (a) having been incident on the target plate 2 generates the plume (b). When this plume (b) reaches the surface of the treated plate 1, the melted semiconductor film 13 is doped with impurity, namely, the dopant which is made up of atoms contained in the plume (b). In this way, doping the semiconductor 13 with the dopant produced by the laser ablation and crystallizing the same by the laser anneal are carried out almost at the same time.

Figure 3:
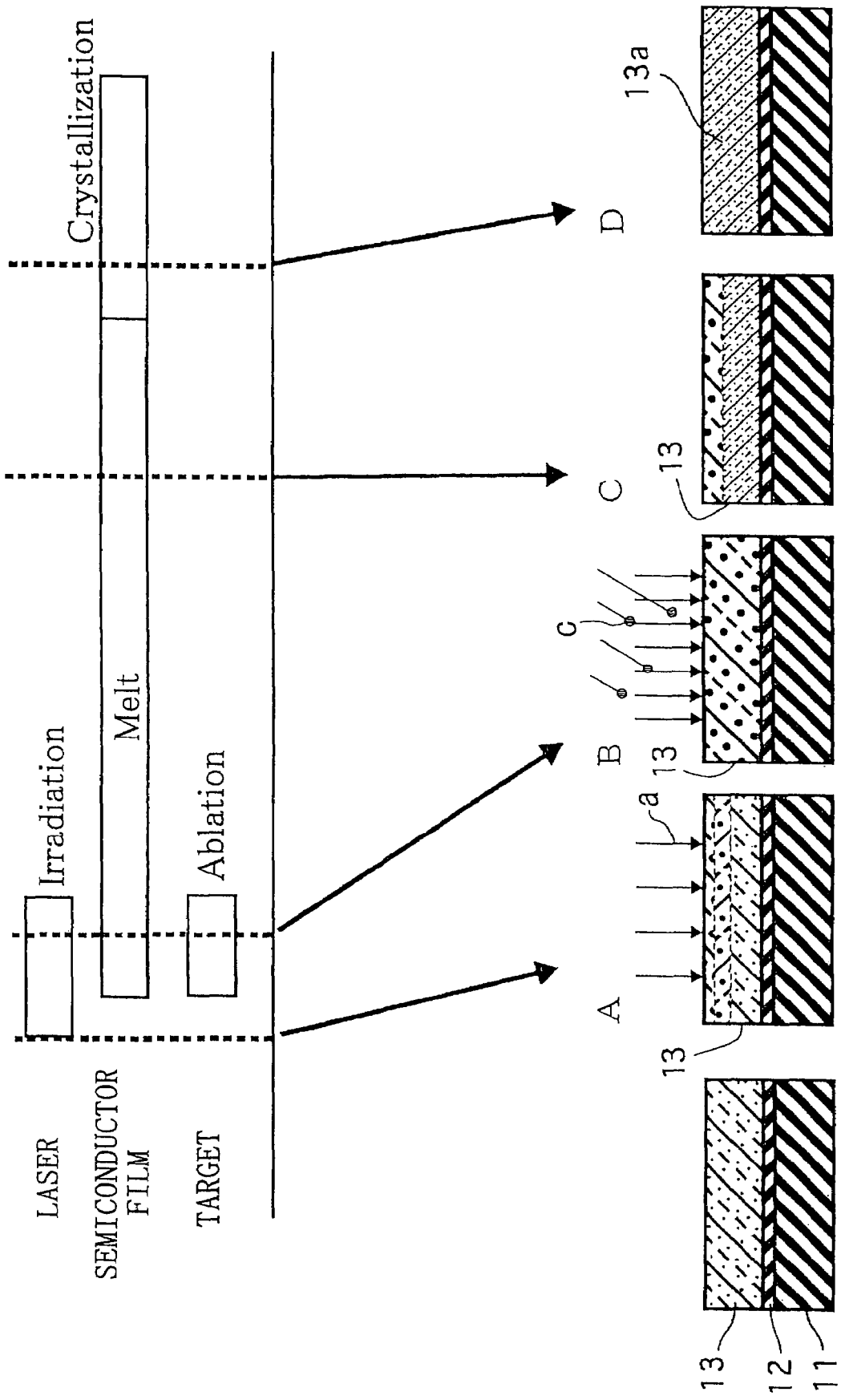
FIG. 3 is a time chart showing a change with the passage of time in a semiconductor film under the irradiation with a laser beam.

FIG. 3 is a time chart showing a change with the course of time in a semiconductor film under the laser beam irradiation by means of the treatment apparatus as shown in FIG. 2 and FIG. 1. The laser beam (a) and the treated plate 1 are relatively moved, and the surface of the semiconductor film 13 is scanned by the laser beam (a). It is the most suitable to move only the treated plate 1 to the laser beam (a) thereby to make a relative motion therebetween.

In FIG. 3, irradiation with the laser beam (a) begins at a time A. After a while, the surface of semiconductor film 13 begins to melt, and at the same time, there takes place the laser ablation of atoms in the target material of the target plate 2. As the result of this, there is generated the plume (b) including the dopant (c) as impurity.

The plume (b) reaches the surface of the melted semiconductor film 13 and the dopant (c) deposits on it at a time B. With this, the semiconductor film 13 is doped with the dopant (c).

At a time C, the dopant (c) depositing on the surface of the semiconductor film 13 incorporates into the melted semiconductor film 13 and uniformly spreads out therein by diffusion, and thereby the semiconductor film 13 is doped. At a time D, the doped semiconductor film 13a is crystallized.

The substrate 11 may be made of glass material for use in LCD, silicon material, plastics material or the like.

The treated plate 1 and the target plate 2 are arranged in the chamber 3 such that the surfaces of the treated plate 1 which is irradiated with the laser beam (a), makes angle ranging from 0° to 90° to the surface of the target plate 2 which is irradiated with the laser beam (a), preferably at an angle of 0°, in other words, the above both surfaces are in parallel with each other. The more closely the surfaces of the target plate 2 and the treated plate 1 faces each other such that the gap or the distance between surfaces of the above two plates 1 and 2 is made to be as small as possible, the more effectively and speedily the surface of the treated plate 1 is doped with the dopant released out of the target plate 2.

In the next, another embodiment of treatment apparatus for annealing and/or doping of semiconductor according to the invention will be described with reference to FIG. 4. In this figure, the same parts as shown in FIGS. 1 and 2 are designated with the same reference numerals and marks in order to avoid repetition of detailed descriptions thereabout.

Figure 4:
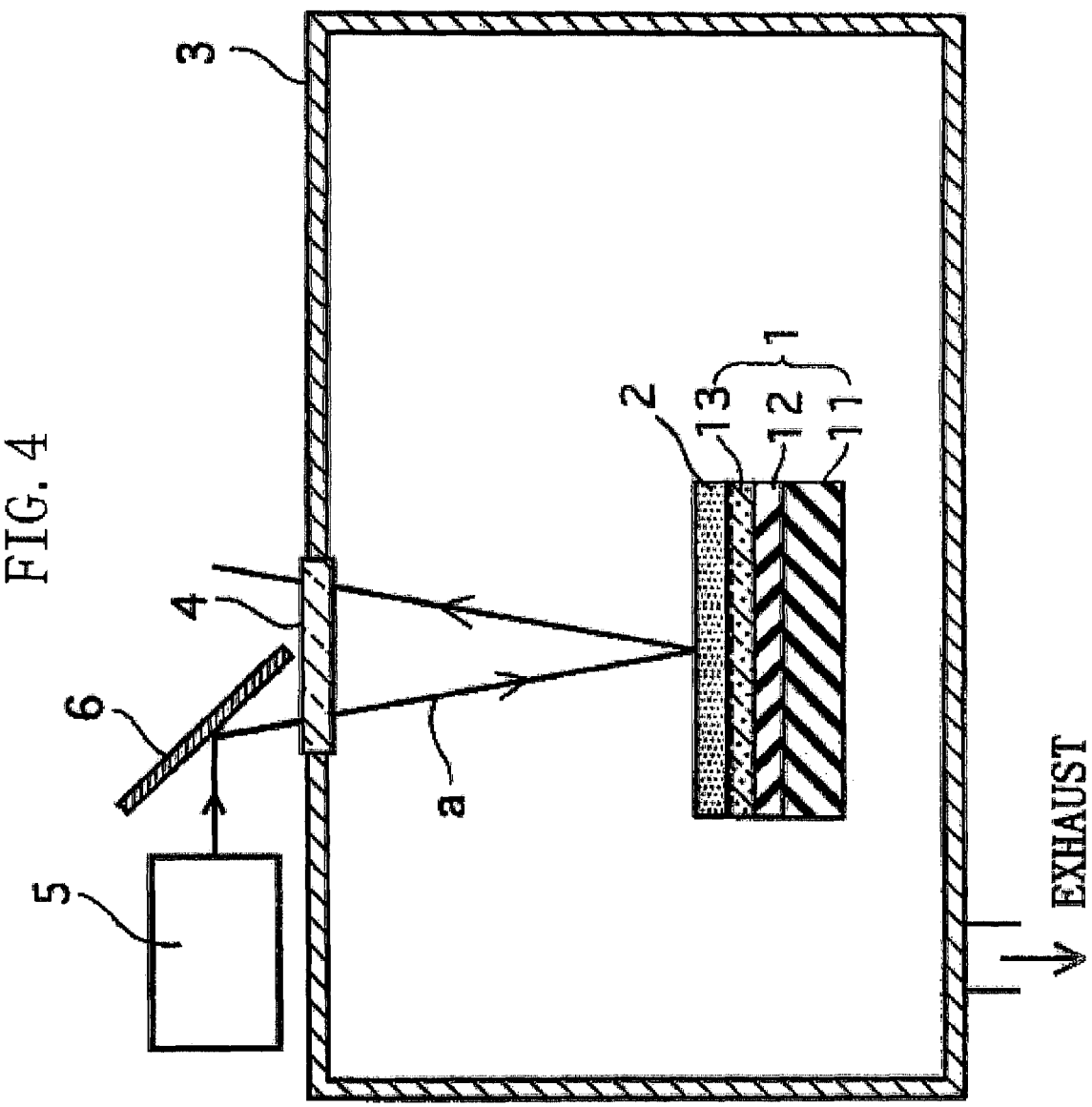
FIG. 4 is a diagram schematically showing treatment apparatus for annealing and/or doping of semiconductor according to another embodiment of the invention.

In this embodiment, the target plate 2 is provided such that it is stacked on the surface of the treated plate 1 to be directly in contact therewith, or such that it is placed in the vicinity of the surface of the treated plate 1 for example, with a small gap (d) to the treated plate 1 as shown in FIG. 4. In the example as shown in FIG. 4, the target plate 2 consists of two layers, that is, a transparent substrate 22 and a thin target material 23. There is a small gap (d) between the surface of the thin target material 23 of the target plate 2 and the surface of the semiconductor film 13 of the treated plate 1. As the result of this, the laser beam (a) emitted from the laser system 5 changes its optical path with the help of the reflecting mirror 6 and proceeds toward the treated plate 1 to irradiate the target plate 2. The laser beam (a) having been incident on the thin target material 23 of the target plate 2 is absorbed and is turned into thermal energy to ablate the atoms contained in the thin target material 23 of the target plate 2. On one hand, the laser beam having been incident on and penetrating through the target plate 2 is incident on the semiconductor film 13. The laser beam having been incident on and absorbed by this semiconductor film 13 is turned into thermal energy to melt this semiconductor film 13. The atoms ablated from the target plate 2 are mixed with the melted semiconductor film 13 and are melted thereinto, thereby the semiconductor film 13 being uniformly doped with the above ablated atoms. After this, the semiconductor film 13 is crystallized.

In the examples as shown in FIGS. 1 and 2, the treated plate 1 and the target plate 2 are arranged such that the former takes a downward position inside the apparatus while the latter takes an upward position. However, this positional relation of the above two plates 1 and 2 may be reversed. If the target plate 2 is arranged to take the downward position inside the apparatus, the target plate 2 may be replaced by a target of the other types, for example, a target crucible which uses a target material as prepared in a crucible.

Figure 5:
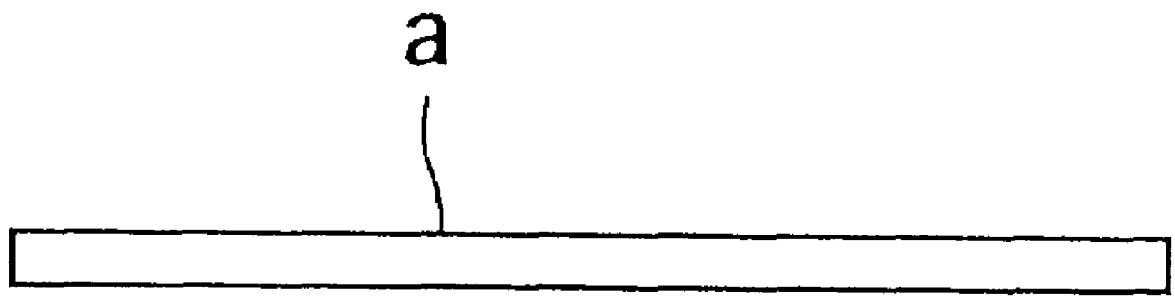
FIG. 5 is a sectional view of a laser beam emitted from a laser system.

The angle of incidence of the laser beam (a') to irradiate the target plate 2 may be set within the limits of angles ranging from 10° to 90°, preferably set at an angle of 45° by taking account of the effect of ablating neutral atoms. Various sorts of laser beams are available for the above-mentioned laser beams (a) and (a'), for example, a pulsed laser beam like a KrF excimer laser beam, a XeCl excimer laser beam and so forth, and further a continuous-wave (CW) oscillating laser beam like a YAG laser beam and others. The wavelength of the above laser beams may be selected from the whole range of the wavelength, that is, from vacuum ultraviolet (VUV) to infrared (IR). It is desirable for the laser beam emitted from the laser system 5 to have a rectangular shaped section as shown in FIG. 5, for example, the shorter side of it has a length of 200 μm to 300 μm while the longer side of it has a length equal to a half (½) of the whole width covered by scanning.

Furthermore, the embodiment of the invention will be described further in detail in the following.

Figure 6:
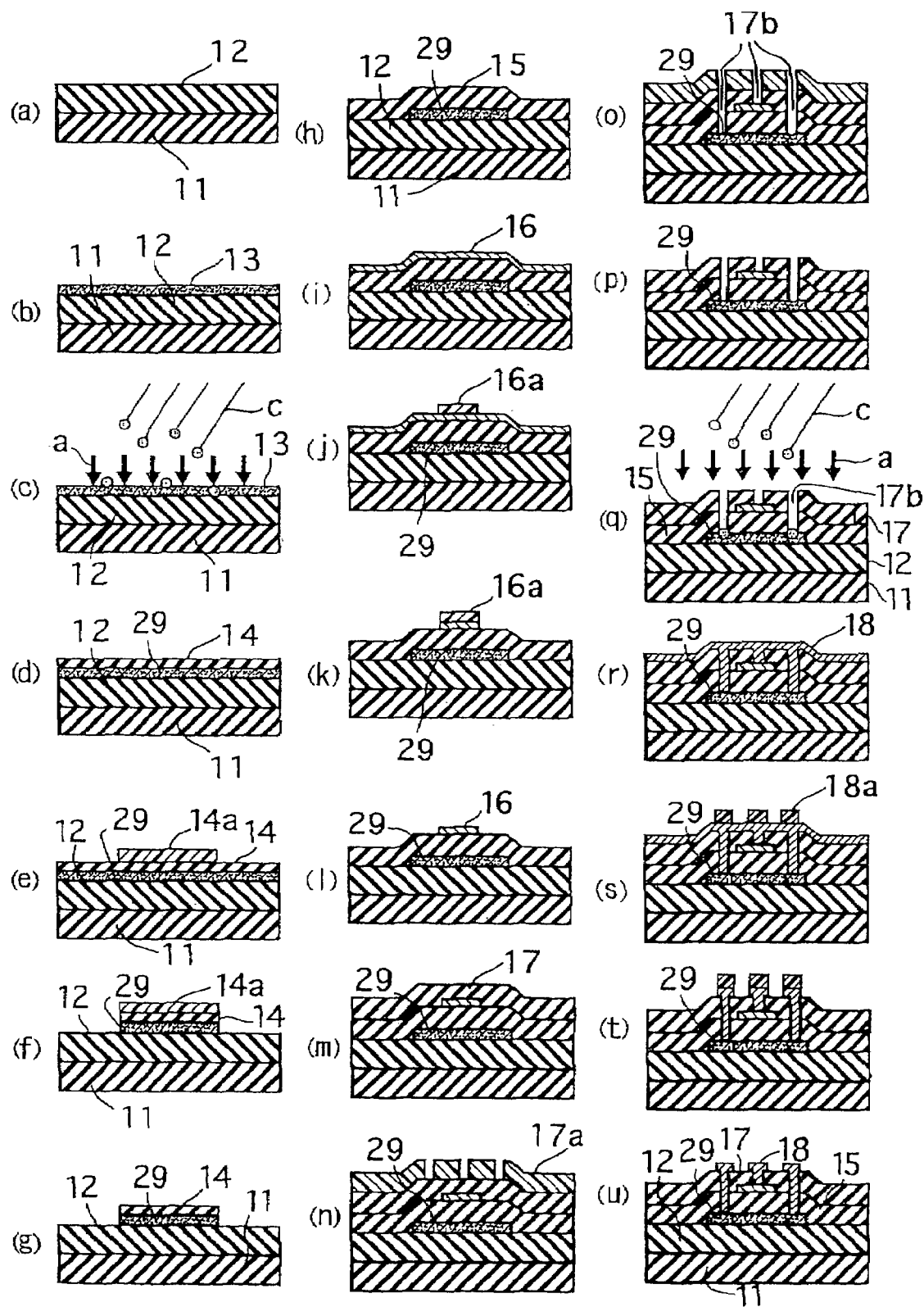
FIGS. 6(a) through 6(u) are sectional views of a semiconductor device at each step of manufacturing it according to a treatment method for annealing and/or doping of semiconductor according to the invention.
Figure 7:
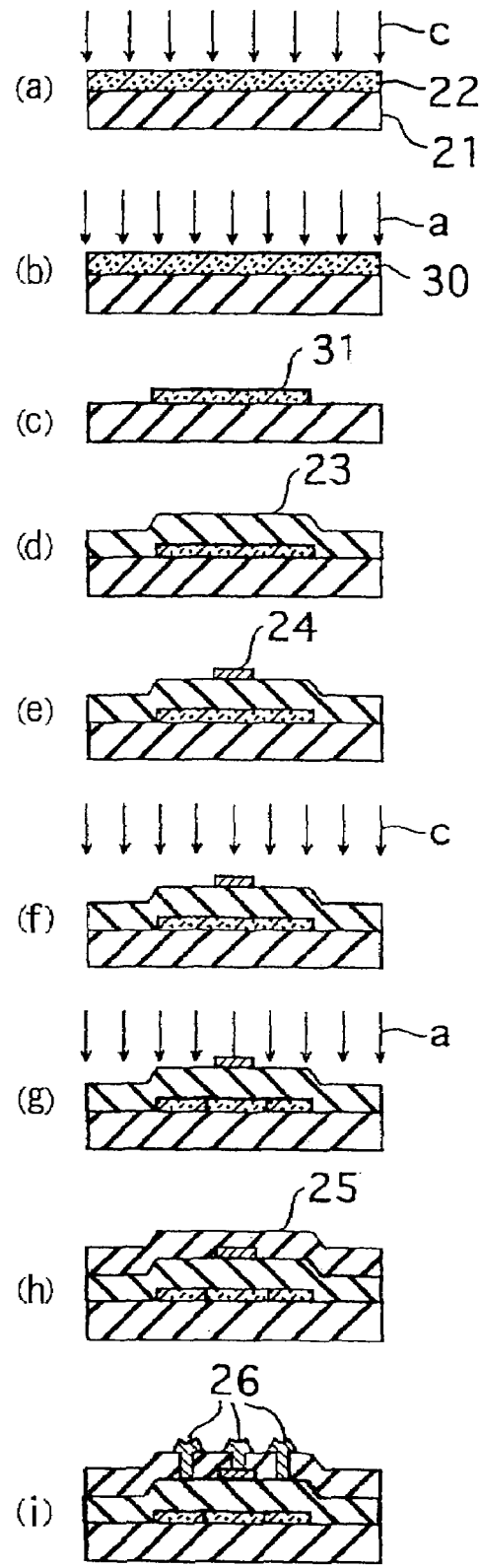
FIG. 7 is a sectional view of a semiconductor device at each step of manufacturing it according to a prior art treatment method for annealing and/or doping of semiconductor.

FIGS. 6(a) through 6(u) are sectional views of a semiconductor device at each step of manufacturing it by means of a treatment method for annealing and/or doping of semiconductor according to the invention. In the following description, a semiconductor thin film transistor (TFT) is used as an exampled of the semiconductor device.

First of all, as shown in FIG. 6(a), a foundation oxide film 12 made of $SiO_2$ and having a thickness of, for example, 800 nm is formed on a substrate 11 made of, for example, glass by means of the plasma CVD method. At this time, the temperature of the substrate 11 and the time for depositing the film are, for example, 500° C. and 40 min, respectively.

In the next, as shown in FIG. 6(b), a-Si film 13 having a thickness of, for example, 100 nm is formed on the foundation oxide film 12 by means of the Low Pressure CVD (referred to as "LPCVD" hereinafter) method using $Si_2H_6$, under the following condition that the flow speed is, for example, 150 sccm, the pressure is, for example, 8 Pa, the substrate temperature is, for example, 450° C. and the film deposition time is, for example, 70 min.

Furthermore, as shown in FIG. 6(c), the a-Si film 13 is irradiated with 10 shots of the laser beam having the strength, that is, the energy density of, for example, 350 mJ·cm$^{-2}$ emitted from the laser systems 5 and 27 constituted by, for example, the KrF excimer pulsed laser unit, thereby the a-Si film 13 being melted and, almost at the same time, the melted a-Si film 13 is doped with the dopant, for example, phosphorous produced by the laser ablation. Crystallizing a-Si film 13 by the irradiation with the KrF excimer laser and making a-Si film 13 an n-type film by doping are carried out almost at the same time, thereby an n-type p-Si film 29 being obtained.

In the next, necessary regions for constituting the TFT are formed in this n-type p-Si film 29. First of all, as shown in FIG. 6(d), a protective oxide film 14 made of, for example, SiO2 and having a thickness of, for example, 10 nm is formed on the n-type p-Si film 29 by means of the LPCVD method under the following condition that the substrate temperature is for exapmle 500° C. and the film deposition time is, for example, 10 min.

As shown in FIGS. 6(e) to 6(g), a photo resist layer 14a is formed on the protective oxide film 14. A pattern for defining a site for a TFT to be formed is illuminated to transferring it on the surface of the photo resist layer 14a (FIG. 6(e)). Then, the protective oxide film 14 and the n-type p-Si film 29 are dry-etched by an etching gas, for example, $CF_4+O_2$ using the pattern as a mask, thereby both of the above films 14 and 29 being processed in the shape of an island (FIG. 6(f)). After completing this etching treatment, the photo resist layer 14a is removed (FIG. 6(g)). The protective oxide film 14 is formed to prevent impurities in the photo resist layer 14a from being introduced to the n-type p-Si film 29. Thus, the protective oxide film 14 is also removed, thereby the n-type p-Si film 29 for use in the TFT being formed.

After the above processes, as shown in FIG. 6(h), a gate oxide film 15 made of $SiO_2$ and having a thickness of, for example, 100 nm is formed on the exposed n-type p-Si film 29 as well as on the foundation oxide film 12 by means of the LPCVD method under the condition that the substrate temperature is, for example, 500° C. and the film deposition time is, for example, 60 min.

In the next, as shown in FIG. 6(i), a film 16 for a gate electrode made of a material, for example, Al and having a thickness of, for example, 100 nm is formed on the gate oxide film 15 by mean of, for example, the spattering method under the condition that the substrate temperature is, for example, 100° C. and the film deposition time is, for example, 10 min.

As shown in FIGS. 6(i) through 6(l), a photo resist layer 16a is formed by spreading or coating, for example, spin-coating the film 16 with a photo resist for use in the gate electrode, and a pattern is illuminated to transfer it to the photo resist layer 16a (FIG. 6(i)). The film 16 for use in the gate electrode is dry-etched by an etching gas, for example, $BCl_3+CH_4$ using the pattern as a mask, thereby the film 16 for use in the gate electrode being processed in the shape of an island (FIG. 6(k)). After completing this etching treatment, the photo resist layer 16a is removed (FIG. 6(l)).

In the next, as shown in FIG. 6(m), a passivation film 17 made of $SiO_2$ and having a thickness of, for example, 200 nm is by means of the plasma CVD method under the condition that the substrate temperature is, for example, 500° C. and the film deposition time is, for example, 20 min.

As shown in FIGS. 6(n) to 6(p), a photo resist layer 17a is formed by spreading or coating, for example, spin-coating the passivation film 17 with a photo resist and then, a pattern for contact holes for wiring connecting among the gate electrode, a source region, and a drain region is formed in the photo resist layer 17a by exposure (Fig. 6(n)). Then, dry-etching with an etching gas, for example, $CHF_3+O_2$ using the above pattern as a mask is performed, thereby contact holes 17b for leading out electrodes being formed (FIG. 6(o)). After completing this etching treatment, the photo resist layer 17a is removed (FIG. 6(p)).

In the next, there is carried out the process of melting the n-type p-Si film 29. As shown in FIG. 6(q), the upper surface of the passivation film 17 is irradiated with 10 shots of the laser beam (a) having the strength, that is, the energy density of, for example, 250 mJ·cm$^{-2}$ emitted from the KrF excimer laser system. A part of the laser beam (a) is directly incident on the n-type p-Si film 29 passing through contact holes 17b while the rest of the laser beam (a) penetrates through the passivation film 17 made of $SiO_2$ as well as the gate oxide film 15 made of $SiO_2$ and then, is incident on the n-type p-Si film 29. With this, the n-type p-Si film 29 is melted.

In the next, there are formed the source and drain regions. While the irradiation with the laser beam (a) is performed, the n-type p-Si film 29 is doped in part with the dopant (c) like phosphorous produced by the laser ablation through contact holes 17b. Accordingly, it takes place almost at the same time that the n-type p-Si film 29 as once melted with irradiation of the laser beam (a) emitted from the KrF excimer pulsed laser system is recrystallized and that the source and drain regions for contact use are formed by doping the n-type p-Si film 29 with the dopant (c). As the result of this, it becomes possible to carry out two processes almost at the same time, one being the process of crystallizing the n-type p-Si film 29 and the other being the process of forming the source and drain regions.

In the next, the wiring process is carried out. As shown in FIG. 6(r), a metal film 18 for use in an electrode made of a metal, for example, Al and having a thickness, for example, 100 nm is formed to cover the entire surface of the semi-finished product as shown in FIG. 6(q) by means of, for example, the spattering method under the condition that the substrate temperature is, for example, 100° C. and the film deposition time is, for example, 10 min.

In the next, as shown in FIGS. 6(s) through 6(u), a photo resist layer 18a is formed by coating, for example, spin-coating the photo resist material over the metal film 18 and then, a wiring pattern is illuminated to transfer it to the photo resist layer 18a (FIG. 6(s)). The photo resist layer 18a is dry-etched by an etching gas. The metal film 18 is dry-etched by the etching gas, for example, $BCl_3+CH_4$, thereby making the metal film 18 into a plurality of electrodes (FIG. 6(t)). Then, the photo resist layer 18a is removed to finish the TFT.

Effect of the Invention

As has been described so far, with the treatment method and the treatment apparatus for annealing and/or doping of semiconductor according to the invention, it becomes possible to carry out the doping by means of the laser ablation and recrystallization by means of the laser anneal in a single process, thus enabling the number of processes of manufacturing a semiconductor device to be reduced.

Furthermore, as it becomes possible to carry out the doping by means of the laser ablation and recrystallization by means of the laser anneal by means of single equipment, it is possible to omit the cleaning of the substrate that is carried out before and after doping process. Thus, there is no possibility that contamination is caused by the substrate cleaning.

Still further, according to the invention, a solid state dopant is used in the doping process; different from the prior art doping process using a gaseous state dopant. Accordingly, not only the safety is enhanced, but also the amount of the dopant needed for doping is reduced.

Still further, if the laser beam reflected by the treated plate is used for laser ablation, there can be improved the utilization efficiency of the energy by the laser anneal system.

What is claimed is:

1. A treatment method for doping and annealing a semiconductor comprising:
   in a controlled environment, irradiating a semiconductor layer formed on a substrate with a first laser beam, thereby melting at least a part of said semiconductor layer;
   in the controlled environment, irradiating a target material having atoms with which said semiconductor layer is to be doped with a second laser beam, thereby ablating said atoms of said target material to make them available to the melted semiconductor layer; and
   in the controlled environment, doping said melted semiconductor layer with said ablated atoms, and allowing the semiconductor layer to recrystalize.

2. A treatment method for doping and annealing a semiconductor comprising:
   in a controlled environment, irradiating an exposed surface of a semiconductor layer formed on a substrate with a laser beam, thereby melting at least a part of said semiconductor layer;
   in a controlled environment, irradiating with a reflected portion of said laser beam a target material having atoms with which said semiconductor layer is to be doped, thereby ablating said atoms of said target material to make them available to the melted semiconductor layer; and
   in a controlled environment, doping said melted semiconductor layer with said ablated atoms, and allowing the semiconductor layer to recrystalize.

3. A treatment method as claimed in claim 1, wherein said laser beam is one of a pulsed laser beam or a continuous-wave laser beam.

4. A treatment method as claimed in claim 1, wherein a wavelength of said laser beam is selected from a range of wavelengths from vacuum ultraviolet to infrared.

5. A treatment method as claimed in claim 1, wherein said substrate is one of glass material, silicon material or plastic material.

6. A treatment method as claimed in claim 2, wherein said laser beam is one of a pulsed laser beam or a continuous-wave laser beam.

7. A treatment method as claimed in claim 2, wherein a wavelength of said laser beam is selected from a range of wavelengths from vacuum ultraviolet to infrared.

8. A treatment method as claimed in claim 2, wherein said substrate is one of glass material, silicon material or plastic material.

9. A treatment method as claimed in claim 1,
   wherein said at least a part of said semiconductor layer, which is irradiated with a first laser beam, makes an angle ranging from 0° to 90° to the surface of said target material, which is irradiated with a second laser beam.

10. A treatment method as claimed in claim 2,
    wherein said at least a part of said semiconductor layer, which is irradiated with said laser beam, makes an angle ranging from 0° to 90° to the surface of said target material, which is irradiated with said laser beam.

11. A treatment method as claimed in claim 2, wherein said substrate is one of glass material, silicon material or plastic material.

12. A treatment method as claimed in claim 1, wherein said first laser beam is emitted from a first source, and said second laser beam is emitted from a second source, which is not the first source.

13. A treatment method as claimed in claim 1, wherein said irradiation of said semiconductor layer and said target material takes place in an air shield chamber.

14. A treatment method as claimed in claim 12, wherein said second laser beam forms an angle of incidence with said target material ranges between about 10° to 90°.

15. A treatment method as claimed in claim 14, wherein said angle of incidence is about 45°.

16. A treatment method as claimed in claim 1, further comprising optically redirecting the first laser beam to selectively irradiate discrete portions of the semiconductor layer.

17. A treatment method as claimed in claim 2, further comprising optically redirecting the laser beam to selectively irradiate discrete portions of the semiconductor layer.

18. A treatment method as claimed in claim 2, wherein the target material is placed proximate to the substrate.

19. A treatment method for doping and annealing a semiconductor comprising:
    in a controlled environment, irradiating a semiconductor layer formed on a substrate with a first laser beam, thereby melting at least a part of said semiconductor layer in a first irradiation step;
    in the controlled environment and temporally overlapping with said first irradiation step, irradiating a target material having atoms with which said semiconductor layer is to be doped with a second laser beam, thereby ablating said atoms of said target material to make them available to the melted semiconductor layer; and
    in the controlled environment, doping said melted semiconductor layer with said ablated atoms, and allowing the semiconductor layer to recrystalize.

* * * * *